(12) United States Patent
Satoh (10) Patent No.: US 9,269,520 B2
(45) Date of Patent: Feb. 23, 2016

(54) ELECTRON GUN, METHOD OF CONTROLLING SAME, AND ELECTRON BEAM ADDITIVE MANUFACTURING MACHINE

(71) Applicant: JEOL Ltd., Tokyo (JP)

(72) Inventor: Takashi Satoh, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/621,526

(22) Filed: Feb. 13, 2015

(65) Prior Publication Data

US 2015/0270088 A1  Sep. 24, 2015

(30) Foreign Application Priority Data

Feb. 14, 2014  (JP) .................................. 2014-26487

(51) Int. Cl.
| | |
|---|---|
| *H01J 29/58* | (2006.01) |
| *H01J 3/08* | (2006.01) |
| *H01J 3/02* | (2006.01) |
| *H01J 37/063* | (2006.01) |
| *H01J 37/305* | (2006.01) |
| *B23K 15/00* | (2006.01) |
| *B23K 15/06* | (2006.01) |
| *B33Y 30/00* | (2015.01) |

(52) U.S. Cl.
CPC ................ *H01J 3/08* (2013.01); *B23K 15/002* (2013.01); *B23K 15/0026* (2013.01); *B23K 15/0086* (2013.01); *B23K 15/06* (2013.01); *H01J 3/02* (2013.01); *H01J 3/024* (2013.01); *H01J 3/027* (2013.01); *H01J 37/063* (2013.01); *H01J 37/305* (2013.01); *B33Y 30/00* (2014.12); *H01J 2237/065* (2013.01); *H01J 2237/06308* (2013.01); *H01J 2237/3128* (2013.01)

(58) Field of Classification Search
CPC ................. H01J 3/02; H01J 3/04; H01J 3/08; H01J 29/04; H01J 29/46; H01J 29/48
USPC .......... 315/3, 14, 15, 382; 313/336, 413, 421, 313/448, 449; 250/492.1–492.3, 501.1
See application file for complete search history.

(56) References Cited

U.S. PATENT DOCUMENTS 4,091,311 A * 5/1978 Mendelsohn ............. H01J 3/02
  313/455
4,363,995 A * 12/1982 Takigawa .................. H01J 1/15
  313/326

FOREIGN PATENT DOCUMENTS

JP  1274349 A  11/1989

*Primary Examiner* — Tung X Le
(74) *Attorney, Agent, or Firm* — The Webb Law Firm (57) ABSTRACT

There is disclosed a method of controlling an electron gun without causing decreases in brightness of the electron beam if a current-limiting aperture cannot be used. The electron gun (10) has a cathode (11), a Wehnelt electrode (12), a control electrode (13), an anode (14), and a controller (22). The Wehnelt electrode (12) has a first opening (12c) in which the tip of the cathode is inserted, and focuses thermal electrons emitted from the tip of the cathode (11). The thermal electrons emitted from the tip of the cathode (11) are caused to pass into a second opening (13c) by the control electrode (13). The anode (14) accelerates the thermal electrons emitted from the cathode (11) such that the thermal electrons passed through the second opening (13c) pass through a third opening (14b) and impinge as an electron beam (B1) on a powdered sample (8). The controller (22) sets the bias voltage and the control voltage based on combination conditions of the bias voltage and control voltage to maintain the brightness of the beam constant.

5 Claims, 10 Drawing Sheets

PRIOR ART

PRIOR ART

Fig. 8

PRIOR ART

Fig. 11

ELECTRON GUN, METHOD OF CONTROLLING SAME, AND ELECTRON BEAM ADDITIVE MANUFACTURING MACHINE

BACKGROUND OF THE INVENTION

1. Field of the Invention

The present invention relates to an electron gun used when a three-dimensional (3D) object is fabricated by stacking thin layers of a powdered sample on top of each other on a support stage. The invention also relates to a method of controlling this electron gun. Furthermore, the invention relates to an electron beam additive manufacturing machine.

2. Description of Related Art

There is a widely known additive manufacturing machine that builds a three-dimensional object by spreading resinous powder tightly over the whole support stage to form a powder layer, irradiating the powder layer with laser light to melt the resinous powder, allowing the molten powder to solidify, and stacking layers of such solidified resinous powder on top of each other. In recent years, additive manufacturing machines using an additive layer manufacturing method for fabricating a three-dimensional object by spreading a powder sample tightly over the whole support stage to form a powder layer, irradiating the powder layer with electron beam as used in an electron microscope to melt the powder sample, allowing the molten powder to solidify, and stacking layers of such solidified powder on top of each other have begun to be used. When powdered sample is irradiated with electron beam in this way, electrical current flows through the electron beam. In the following description, this electrical current is referred to as the "beam current".

In an electron microscope that is one example of instrument using an electron beam, a beam current from on the order of pA to on the order of microamperes is used to observe a tiny sample. The accelerating voltage of an electron gun used in an electron microscope is tens of kV or higher, less than or comparable to hundreds of kV. However, the amount of current is as low as tens of microamperes at most and so the electron beam power is not so large. This permits a beam blocking member to be installed inside the optical system. In an electron microscope, a current-limiting aperture is placed inside the optical system, and a required value of beam current is obtained by controlling the amount of the electron beam passing through the aperture by means of an electromagnetic lens. The advantage of this method of beam current control is that the beam current can be modified while maintaining the electron gun conditions unchanged. That is, the electron gun can continue to be used always under optimum conditions irrespective of beam current conditions.

On the other hand, an electron beam additive manufacturing machine uses a large-output electron beam generally having a large current of tens of mA in order to melt a powdered sample. The beam is accelerated by 10 kV or higher. If such a large-power electron beam irradiates the current-limiting aperture, the aperture may be damaged. This makes it impossible to control the beam current using the current-limiting aperture. If a current-limiting aperture is not used, all of the electron beam emitted from the cathode will reach a powdered sample. As a result, the beam cannot enough be focused. Consequently, it is difficult to fabricate an object accurately. For this reason, in the electron beam additive manufacturing machine, the electron beam emitted from the electron gun is controlled using a bias voltage to vary the beam current. When the bias voltage of the electron gun is varied, what vary concomitantly are not restricted to the beam current. All electron gun characteristics including the brightness and the diameter of the light source vary.

JP-A-1-274349 discloses an electron gun that has a filament emitting thermal electrons, an extractor electrode for extracting thermal electrons from the filament, a Wehnelt electrode for focusing the thermal electrodes extracted from the filament, and an anode for accelerating the focused thermal electrons.

Generally, a process for melting a powdered sample used in an additive manufacturing process starts with preheating the powdered sample. Then, the sample is molten to form fringes of the object to be fabricated. Then, the sample is molten to form the interior of the object. The required value of the beam current of the electron beam irradiated at the powdered sample from the electron gun and the required value of the diameter of the beam when the beam is focused on a Z-axis stage are different for different melting processes. Therefore, it is necessary to control these parameters by varying the operative conditions of the electron gun and of the lens varying the beam diameter. For example, while one powdered layer is being molten, the beam current must be varied from several milliamperes to tens of milliamperes. If the beam current is varied, the brightness of the electron beam changes. This may result in the sample being molten nonuniformly.

SUMMARY OF THE INVENTION

In view of the foregoing circumstances, the present invention has been made. It is an object of the present invention to provide an electron gun which does not use any current-limiting aperture but prevents the brightness (current density per unit solid angle—amps/cm$^2$/steradian) of the electron beam from dropping.

The present invention provides an electron gun that has a cathode, a Wehnelt electrode, a control electrode, an anode, and a controller. The cathode is heated by a heating power supply and operative to emit thermal electrons from a tip of the cathode. The Wehnelt electrode has a central axis along which a first opening is formed. The tip of the cathode is inserted in the first opening. A bias voltage is applied to the Wehnelt electrode to control a thermal electron emissive region of the cathode, and to focus the thermal electrons. The control electrode has a central axis along which a second opening is formed. A control voltage is applied to the control electrode to cause the thermal electrons emitted from the tip of the cathode to pass into the second opening. The anode has a central axis along which a third opening is formed. An accelerating voltage is applied to the anode such that the thermal electrons emitted from the cathode are accelerated and that the thermal electrons passed through the second opening are passed into the third opening and impinge as an electron beam on a powdered sample. The controller sets the bias voltage and the control voltage based on combination conditions of the bias voltage and the control voltage to maintain the brightness of the electron beam constant when a beam current produced by the electron beam impinging on the powdered sample is varied.

In this electron gun, the brightness of the electron beam can be kept constant by controlling the electric field strength at the tip of the cathode by the control electrode.

DESCRIPTION OF THE INVENTION

An electron gun, a method of controlling it, and an electron beam additive manufacturing (AM) machine associated with one embodiment of the present invention are hereinafter described with reference to the accompanying drawings. In this electron beam AM machine, there is achieved a method of controlling an electron gun wherein the electron gun is controlled such that the brightness of the electron beam is kept constant. In the present specification and drawings, components which are substantially identical in function or configuration are indicated by the same reference numerals and so a repeated description thereof is omitted.

<Configuration of Electron Beam Additive Manufacturing Machine>

Figure 1:
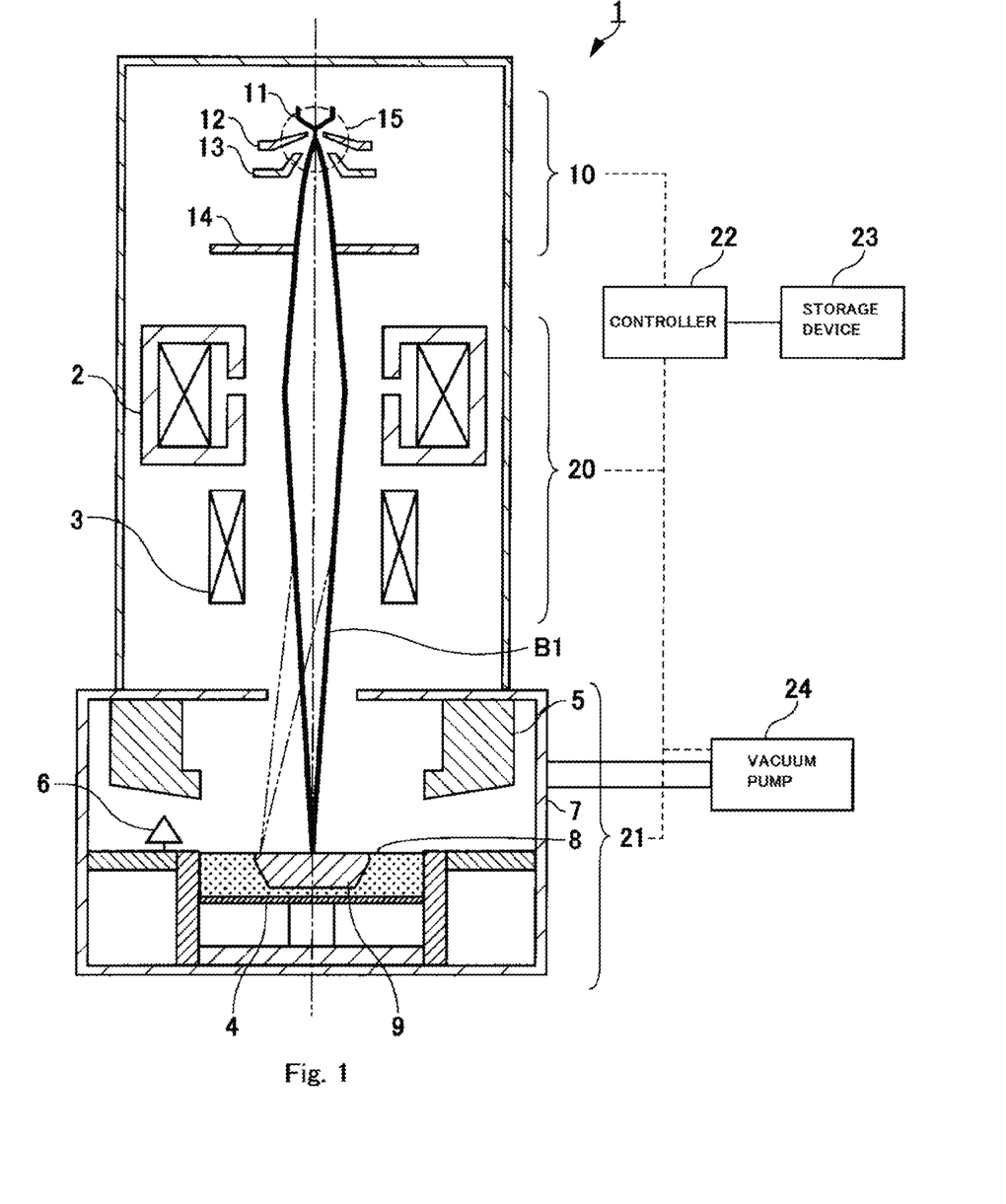
FIG. 1 is a vertical cross-sectional view, partly in block form, of an electron beam additive manufacturing machine associated with one embodiment of the present invention.

FIG. 1 shows the configuration of an electron beam additive manufacturing machine employing a layer manufacturing method, the machine being indicated by reference numeral 1. This additive manufacturing (AM) machine 1 can directly fabricate a complex part from data created by a three-dimensional CAD (computer-aided design) in the same way as a conventional additive manufacturing machine. However, the electron beam AM machine 1 can produce three-dimensional objects more quickly and accurately than heretofore by making use of an electron beam B1. Furthermore, the electron beam AM machine 1 can produce high-strength metal parts, which has been heretofore difficult to achieve.

The electron beam AM machine 1 has an electron gun 10, an electron optical system 20 for scanning the electron beam B1 focused to a required value of beam diameter over a powdered sample 8, and a sample supply system 21 for supplying the powdered sample 8 onto a Z-axis stage 4 and spreading the sample tightly over the whole stage 4 that can move in the direction of the Z-axis. Furthermore, the electron beam AM machine 1 has a controller 22 acting as a control system for controlling various parts of the electron beam AM machine 1, a computer storage device 23 for storing control programs, combination conditions of a bias voltage and a control voltage (described later), and other related information, and a vacuum pump 24 for evacuating the interior of an additive manufacturing (AM) chamber 7. The electron gun 10, electron optical system 20, sample supply system 21, and Z-axis stage 4 are mounted in an evacuated housing including the additive manufacturing chamber 7.

The electron gun 10 of the thermionic emission type includes four electrodes, i.e., a cathode 11, a Wehnelt electrode 12, a control electrode 13, and an anode 14, and emits the electron beam B1 toward the Z-axis stage 4 to fabricate a three-dimensional object 9 with additive manufacturing. The electron gun 10 has a thermal electron emissive region 15. The configurations of the gun 10 and the emissive region 15 will be described in detail later.

The electron optical system 20 has an electromagnetic lens 2 and a deflector 3. The lens 2 operates to further condense the electron beam B1 by an electromagnetic action, the beam being emitted from the electron gun 10, and to bring the electron beam B1 into focus on the Z-axis stage 4. The deflector 3 deflects the electron beam B1 passed through the lens 2 into a given position on the Z-axis stage 4.

The sample supply system 21 includes a powdered sample container 5 and a powder layer raking arm 6. The interior of the additive manufacturing chamber 7 is evacuated by the vacuum pump 24 to prevent deterioration of the powdered sample 8. The Z-axis stage 4 can move an incremental distance in the vertical direction whenever one layer of the powdered sample 8 is formed. The powdered sample 8 is spread tightly over the whole Z-axis stage 4 to form a bed of the powder at a given height by the powder layer raking arm 6 that can move in a horizontal direction.

The operation of the electron beam additive manufacturing machine 1 is described. First, the vacuum pump 24 evacuates the interior of the additive manufacturing chamber 7. Then, the powdered sample 8 is supplied onto the Z-axis stage 4 from the powdered sample container 5. The powder layer raking arm 6 that moves horizontally spreads the powdered sample 8 over the Z-axis stage 4 uniformly and tightly until a required height (e.g., the diameter of the grains of the powdered sample 8) is achieved. Subsequently, the electron beam B1 emitted from the electron gun 10 is irradiated powdered sample 8 on the Z-axis stage 4.

At this time, the cathode 11 is heated by a heating power supply (not shown) and emits thermal electrons. A bias voltage that is a negative potential is applied to the Wehnelt electrode 12 from a bias voltage source (not shown) to control the thermal electron emissive region 15 of the cathode 11. Furthermore, the thermal electrons are focused. The control voltage that is a positive potential is applied to the control electrode 13 to extract the thermal electrons in the vertical direction from the tip of the cathode 11. An accelerating voltage is applied to the anode 14 from an accelerating voltage source (not shown) to accelerate the thermal electrons emitted from the cathode 11. The electrons are directed as the electron beam B1 at the powdered sample 8. The controller 22 sets the bias voltage and the control voltage according to the combination condition of the bias voltage and control voltage read from the storage device 23 in order to maintain the brightness of the electron beam B1 constant when the beam current generated by the electron beam B1 impinging on the powdered sample 8 is varied.

The electron beam B1 is controlled to lie at a given position by the electron optical system 20, and operative to melt the powdered sample 8 on the Z-axis stage 4 at high temperature. After the electron beam B1 has passed by, the molten powdered sample 8 begins to solidify. When a given shape is created on the Z-axis stage 4 by the electron beam B1, the Z-axis stage 4 descends an incremental distance corresponding to one layer height of the powdered sample 8. The supply of the powdered sample 8 by the sample supply system 21 and the shape formation by the electron gun 10 and the electron optical system 20 described so far are repeated.

After each layer of the sample is molten by the electron beam B1 in this way, a slice of structure is formed by the solidified powdered sample 8. The slice of structure has been extracted at a plane at each one of the heights of the layers of powder from the three-dimensional object 9. The electron beam additive manufacturing machine 1 irradiates each layer of the powdered sample 8 with the electron beam B1. The powdered sample 8 is molten and solidified repeatedly. Finally, the desired three-dimensional object 9 is created.

<Configuration of Related Art Electron Gun>

Figure 2:
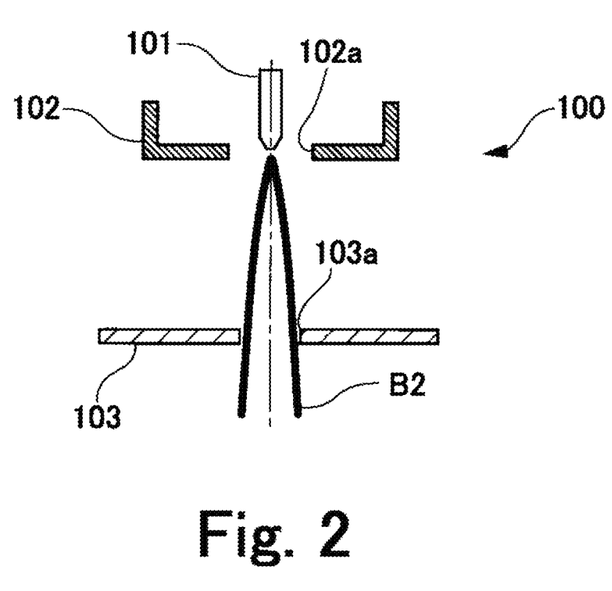
FIG. 2 is a schematic vertical cross-sectional view of a related art electron gun.
Figure 3:
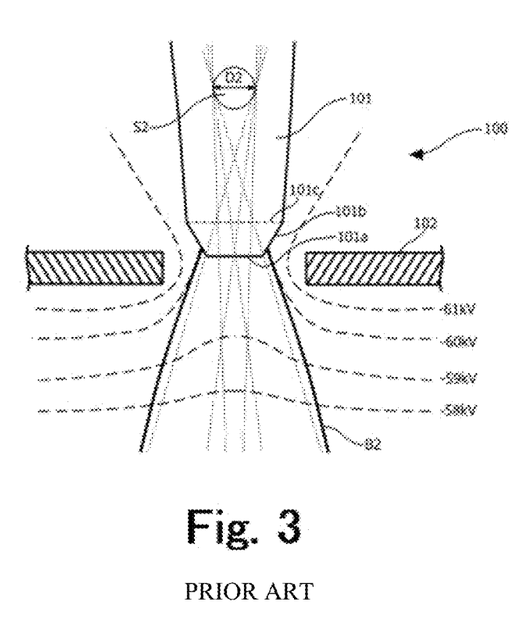
FIG. 3 is an explanatory diagram representing equipotential lines around the related art electron gun shown in FIG. 2.

The configuration of the electron gun 100 of the thermionic emission type used in a related art electron beam additive manufacturing machine is described by referring to FIGS. 2 and 3. FIG. 2 shows the configuration of the related art electron gun 100. This gun 100 has three electrodes, i.e. a cathode 101, a Wehnelt electrode 102, and an anode 103.

The cathode 101 is electrically energized by the heating power supply (not shown) and heated. As a result, thermal electrons are emitted from the tip of the cathode 101. The Wehnelt electrode 102 that is close to the cathode 101 is formed like a dish having a flat plate. The flat plate like portion is centrally provided with a first opening 102a to pass the thermal electrons. A bias voltage that is a negative potential is applied to the cathode 101. The Wehnelt electrode 102 controls a thermal electron emissive region locally present at the tip of the cathode 101 and focuses the electron beam, B2. Similarly, the anode 103 mounted below the Wehnelt electrode 102 has a flat plate like portion centrally provided with a second opening 103a to pass the thermal electrons. An accelerating voltage is applied to the anode 103 from an accelerating voltage source (not shown) to extract thermal electrons from the cathode 101 in one direction (i.e., the downward of the vertical direction). The thermal electrons passed through the second opening 103a of the anode 103 form the electron beam B2 and reach the powdered sample (not shown) forming a bed on the Z-axis stage (not shown), thus melting the powdered sample.

The electron gun 100 uses the thermal electrons emitted under a degree of vacuum of $10^{-4}$ Pa or below as the electron beam B2. The electron beam having a large current of tens of mA or more can melt the powdered sample.

The electron beam B2 is described by referring to FIG. 3. This is an enlarged view of the related art electron gun 100, showing equipotential lines around the cathode 101. FIG. 3 shows equipotential lines around the cathode 101 in kV. Thus, it is shown that a negative potential, for example, of −60 kV is applied to the cathode 101. Thermal electrons are emitted from a flat surface portion 101a of the cathode 101. Thermal electrons are also emitted from a part of a tapering portion 101b continuous with the flat surface portion 101a. It is assumed that the trajectories of the electron beam B2 emitted from the electron gun 100 are pulled back to the electron gun side, i.e., in a direction reverse to the direction of motion of the electron beam as indicated by dotted lines in FIG. 3. An imaginary crossover of the electron beam that seems as if it were generated from the electron gun side is referred to as the virtual source S2. In the following description, the diameter of the virtual source S2 is referred to as the virtual source diameter D2. The virtual source S2 may be formed inside the cathode 101 as shown in FIG. 3.

<Configuration of the Electron Gun Associated with the Present Embodiment>

Figure 4:
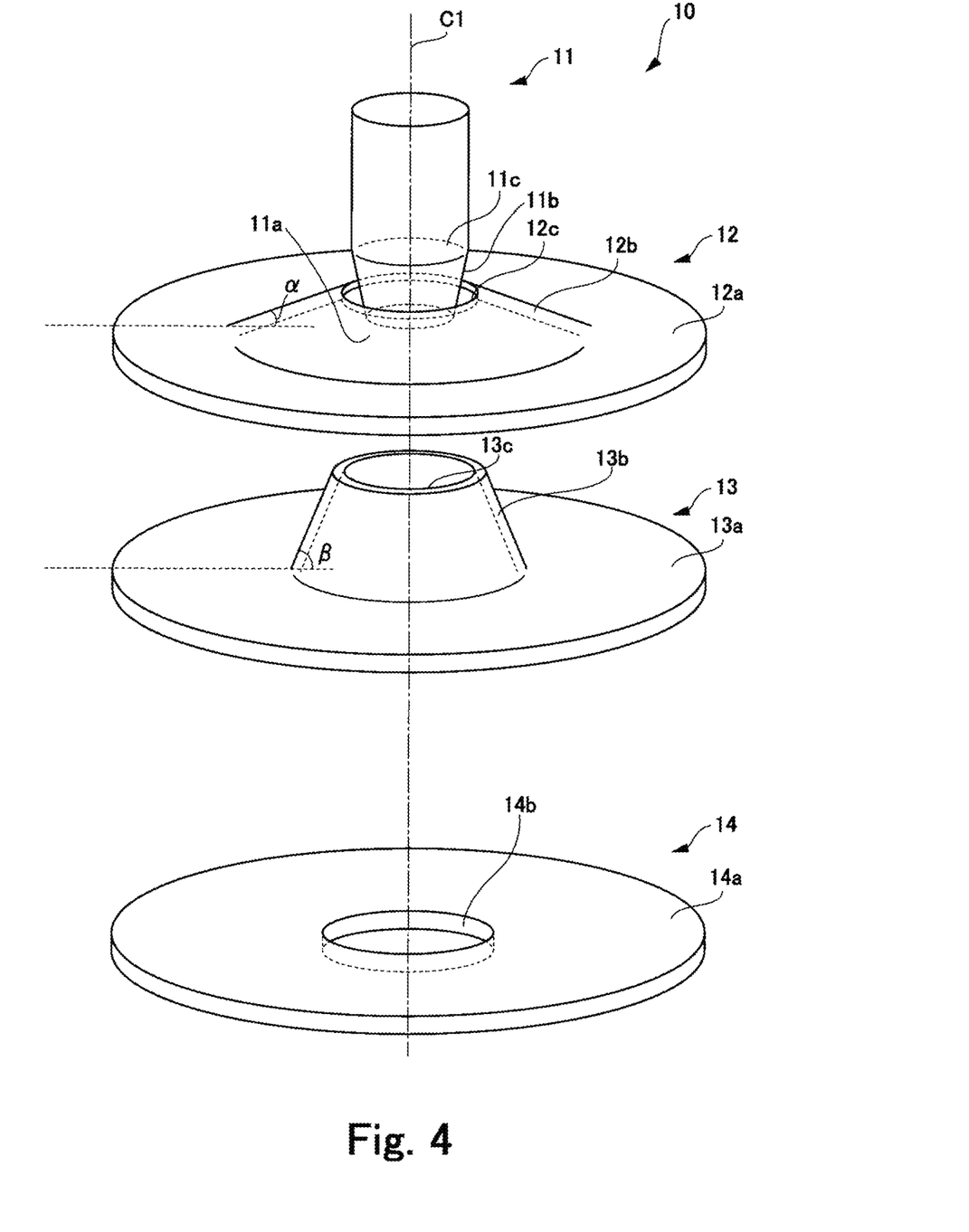
FIG. 4 is an enlarged perspective view of an electron gun associated with one embodiment of the invention.
Figure 5:
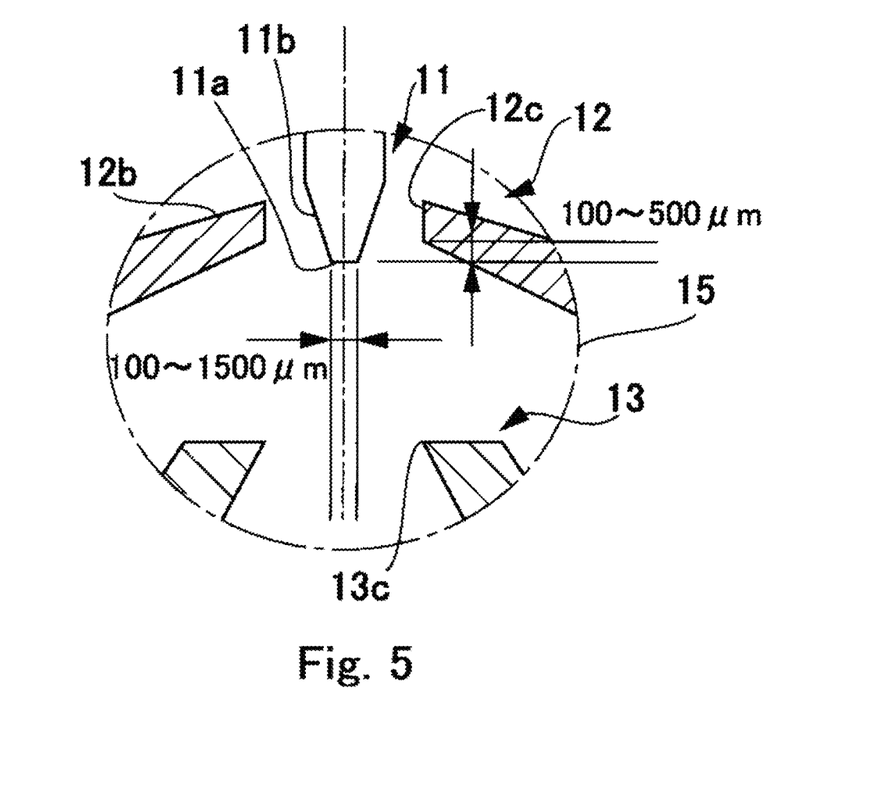
FIG. 5 is a fragmentary enlarged cross section of the vicinities of the cathode shown in FIG. 1.
Figure 6:
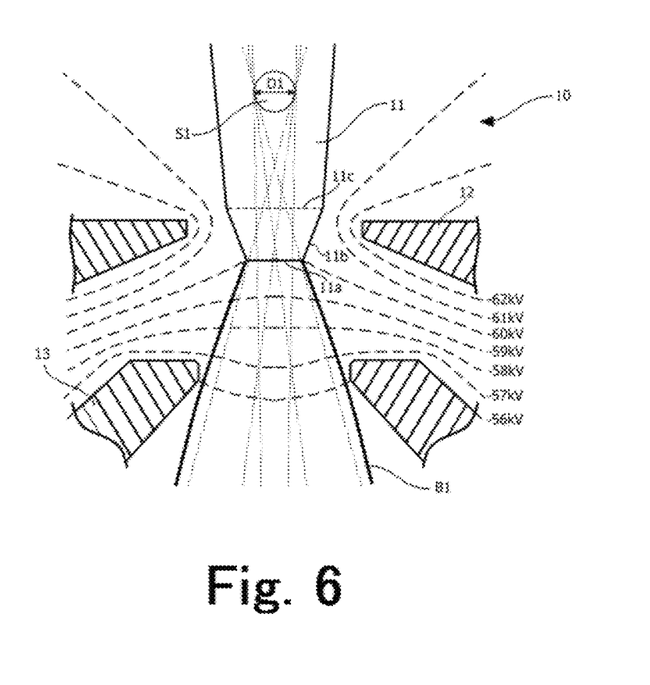
FIG. 6 is an explanatory diagram illustrating equipotential lines around the electron gun shown in FIG. 4.

The configuration and operation of the electron gun 10 of thermionic emission type used in the electron beam additive manufacturing machine 1 associated with the present embodiment are next described by referring to FIGS. 4-6. FIG. 4 is an enlarged perspective view of the electron gun 10. FIG. 5 is a fragmentary, enlarged cross section of the vicinities of the cathode 11 shown in FIG. 1.

As described previously, the electron gun 10 has the four electrodes, i.e., cathode 11, Wehnelt electrode 12, control electrode 13, and anode 14. The Wehnelt electrode 12, control electrode 13, and anode 14 are fixedly located and spaced from each other in a direction perpendicular to the direction in which thermal electrons are emitted.

The cathode 11 is shaped like a truncated cone having a front end facing downwardly in the vertical direction. This front end has a flat surface portion 11a, a tapering portion 11b, and a bottom surface portion 11c. The cathode 11 is electrically energized by the heating power supply (not shown) and heated. Thus, thermal electrons are emitted from the flat surface portion 11a.

The Wehnelt electrode 12 has a flat surface portion 12a, a tapering portion 12b, and a first opening 12c. The flat surface portion 12a is located substantially parallel to the horizontal direction. The tapering portion 12b is tilted toward the cathode 11 at a tilt angle α of 20 to 50 degrees relative to the horizontal surface of the flat surface portion 12a. The tapering portion 12b has a central axis C1 along which the first opening 12c is formed. The whole of the flat surface portion 11a that is at the front end of the cathode 11 and a part of the tapering portion 11b are inserted in the first opening 12c. Emission of thermal electrons from the tapering portion 11b of the cathode 11 is limited by the bias voltage applied to the Wehnelt electrode 12.

The control electrode 13 has a flat surface portion 13a, a tapering portion 13b, and a second opening 13c. The flat surface portion 13a is located nearly parallel to the horizontal direction. The tapering portion 13b is tilted toward the Wehnelt electrode 12 at a tilt angle β of 30 to 60 degrees relative to the horizontal surface of the flat surface portion 13a. The tilt angle β of the tapering portion 13b is greater than the tilt angle α of the tapering portion 12b of the Wehnelt electrode 12. The tapering portion 13b has the central axis C1 along which the second opening 13c is formed. Thermal electrons emitted from the cathode 11 and focused by the Wehnelt electrode 12 pass through the second opening 13c. A control voltage is applied to the control electrode 13 by the controller 22 to pull out thermal electrons staying around the tip of the cathode 11 due to space charge effects.

The anode 14 has a flat surface portion 14a and a third opening 14b. The flat surface portion 14a is located nearly parallel to the horizontal direction. The flat surface portion 14a has the central axis C1 along which the third opening 14b is formed. Thermal electrons passed through the second opening 13c of the control electrode 13 are passed into the third opening 14b by the anode 14.

As shown in the thermal electron emissive region 15 of the electron gun shown in FIG. 5, the diameter of the flat surface portion 11a of the cathode 11 is set within the range of 100 to 1500 μm and so a large beam current can be obtained from the electron gun 10. The cathode 11 is inserted in the first opening 12c of the Wehnelt electrode 12. The flat surface portion 11a is made to protrude about approximately 100 to 500 μm downwardly from the lower end of the first opening 12c. The flat surface portion 11a is located to be received within the tapering portion 12b of the Wehnelt electrode 12. Consequently, the Wehnelt electrode 12 can control the thermal electron emissive region 15 at the tip of the cathode 11 with a low bias voltage.

FIG. 6 is an enlarged view of the electron gun 10, also showing equipotential lines. In FIG. 6, the equipotential lines are represented in kV. It is shown that a negative potential, for example, of −60 V is applied to the cathode 11 of the electron gun 10. It is assumed that the trajectories of the electron beam B1 emitted from the electron gun 10 are pulled back to the electron gun side, i.e., in a direction reverse to the direction of travel of the electron beam as indicated by dotted lines in FIG. 6. An imaginary crossover of the electron beam that seems as if it were generated from the electron gun side is referred to as the virtual source S1. In the following description, the diameter of the virtual source S1 is referred to as the virtual source diameter D1.

In this way, the tapering portion 11*b* of the cathode 11 is shaped like a truncated cone having the flat surface portion 11*a* at its tip. The flat surface portion 11*a* is inserted in the first opening 12*c* and located on a side of the control electrode 13. The bottom surface portion 11*c* is fixed at a position above the first opening 12*c* of the Wehnelt electrode 12. Consequently, emission of thermal electrons emitted from the tapering portion 11*b* of the cathode 11 can be suppressed by the bias voltage. The control electrode 13 is so placed that the second opening 13*c* is as close as possible to the tip of the cathode 11 by making use of the tapering portion 12*b* formed on the Wehnelt electrode 12. As described previously, the control voltage being a positive potential is applied to the control electrode 13. The strength of the electric field between the second opening 13*c* of the control electrode 13 and the tip of the cathode 11 can be varied at will by varying the value of the control voltage. Consequently, the controller 22 can control the beam current using both the bias voltage applied to the Wehnelt electrode 12 and the control voltage applied to the control electrode 13.

In this case, there should be plural combination conditions of the control voltage and the bias voltage when a required value of beam current should be obtained. It is considered that if a combination giving the highest brightness is selected from the plural combinations, decreases in the brightness when the beam current varies can be suppressed. Combination conditions of the control voltage and the bias voltage are discussed below.

<Related Art Method of Controlling Electron Gun>

Regarding the related art electron gun 100, the relation between the bias voltage and the electron gun characteristics were simulated. The results are described by referring to FIGS. 7 and 8. The electron gun characteristics described below are the virtual source diameter D2, the beam semiangle of the electron beam B2, the beam current, and the brightness of the electron beam B2. In the following graphs, symbols are omitted from being shown.

Figure 7:
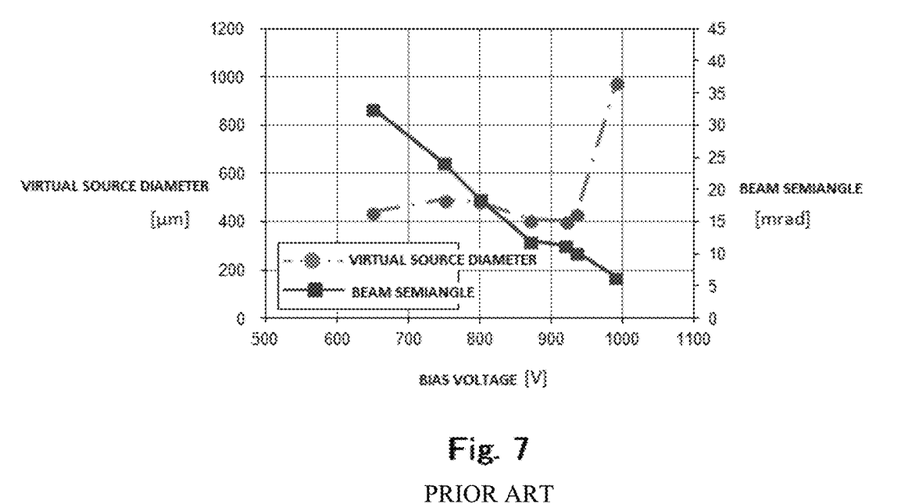
FIG. 7 is a graph showing curves illustrating an example in which a virtual source diameter and a beam semiangle vary when the bias voltage to the related art electron gun shown in FIG. 2 is varied.

FIG. 7 is a graph showing curves illustrating one example in which the virtual source diameter D2 and the beam semiangle vary when the bias voltage is varied. In FIG. 7, when the bias voltage was increased from 650 V to 930 V, the virtual source diameter D2 varied only a little between 400 and 500 μm. However, it is shown that when the bias voltage was increased close to 1,000 V, the diameter increased rapidly to 1,000 μm. It is clear also from FIG. 7 that as the bias voltage increased, the beam semiangle decreased. The beam angle denotes the spread of the electron beam B2 occurring in the horizontal direction, the beam being emitted from the electron gun 100. As the beam angle decreases, aberration in the electron beam caused when it passes through a lens decreases.

Figure 8:
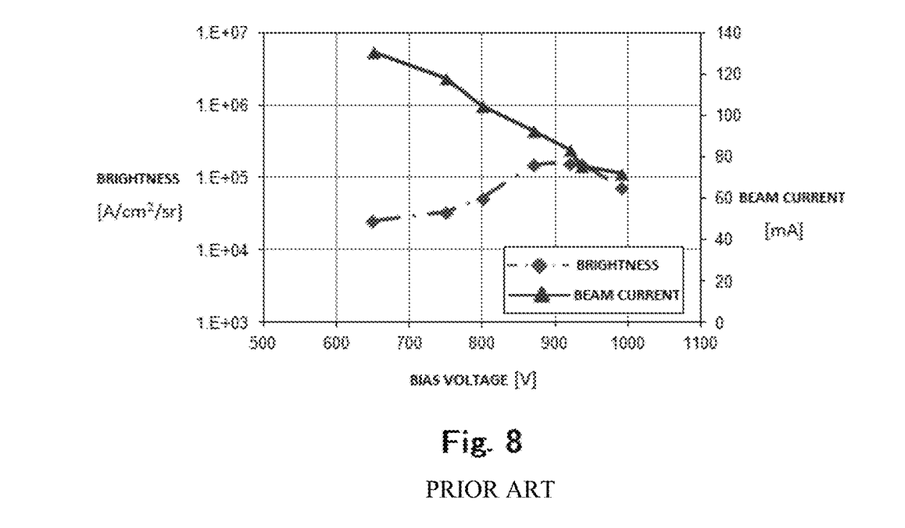
FIG. 8 is a graph showing curves illustrating an example in which the brightness and the beam current vary when the bias voltage to the related art electron gun shown in FIG. 2 is varied.

FIG. 8 is a graph showing curves illustrating one example in which the brightness and the beam current vary when the bias voltage is varied. When the bias voltage was increased from 650 V to 1,000 V, the beam current decreased linearly. On the other hand, the brightness of the electron beam B2 tended to increase when the bias voltage was varied from 650 V to 930 V but the tendency reversed itself and began to decrease after approximately 930 V was exceeded. This result indicates that a maximum brightness occurs under certain bias voltage conditions. A high brightness means that the beam current per unit area and the beam current per solid angle are large. If the brightness is high, a powdered sample can be molten easily. Furthermore, when the brightness is higher, the electron beam B2 can be narrowed down to a smaller diameter. Hence, additive manufacturing can be performed accurately.

The results given so far show that it is possible to obtain a required value of beam current even using a general thermionic emission type electron gun but the brightness decreases if the beam current is increased or reduced. Therefore, if it is attempted to control the beam current using a Wehnelt electrode in the same way as in the related art electron beam additive manufacturing machine, beam currents producing high brightness are available in some cases. In other cases, such currents are not available. In consequence, a powdered sample tends to be molten nonuniformly.

<Method of Controlling Electron Gun Associated with the Present Embodiment>

Figure 9:
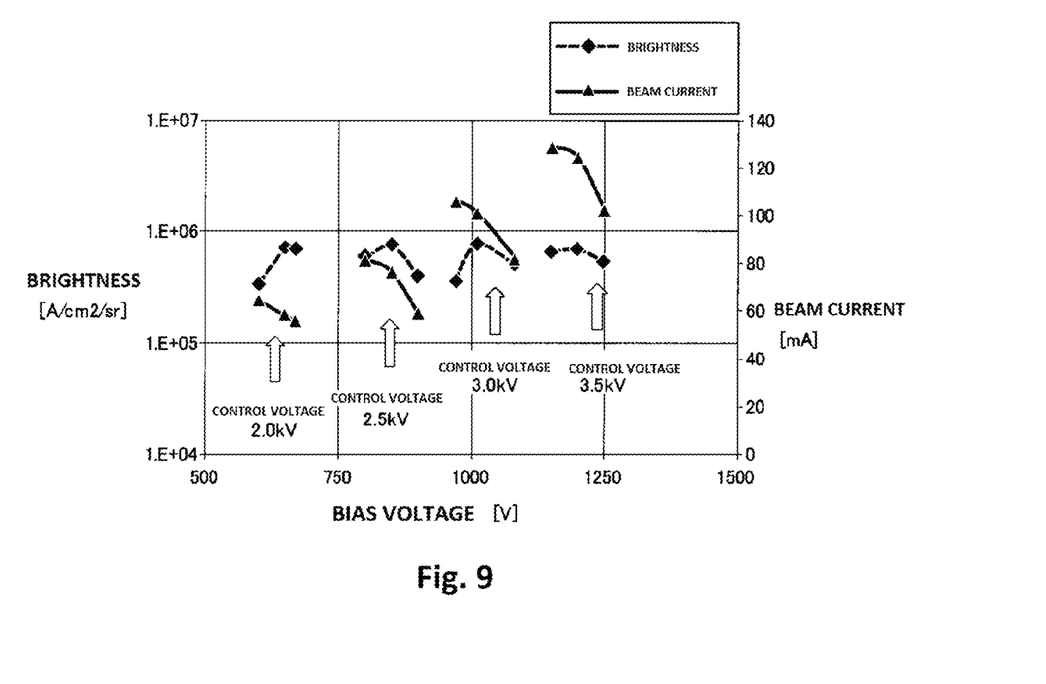
FIG. 9 is a graph showing one example of how the beam current and brightness vary when the bias voltage and the control voltage of the inventive electron gun shown in FIG. 4 are varied.
Figure 10:
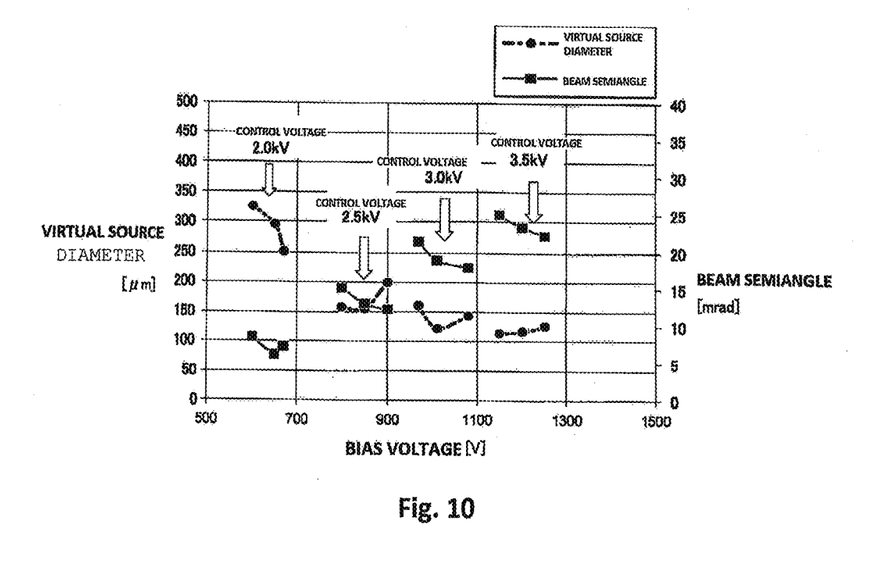
FIG. 10 is a graph showing one example of how the virtual source diameter and beam semiangle vary when the bias voltage and the control voltage of the inventive electron gun shown in FIG. 4 are varied.
Figure 11:
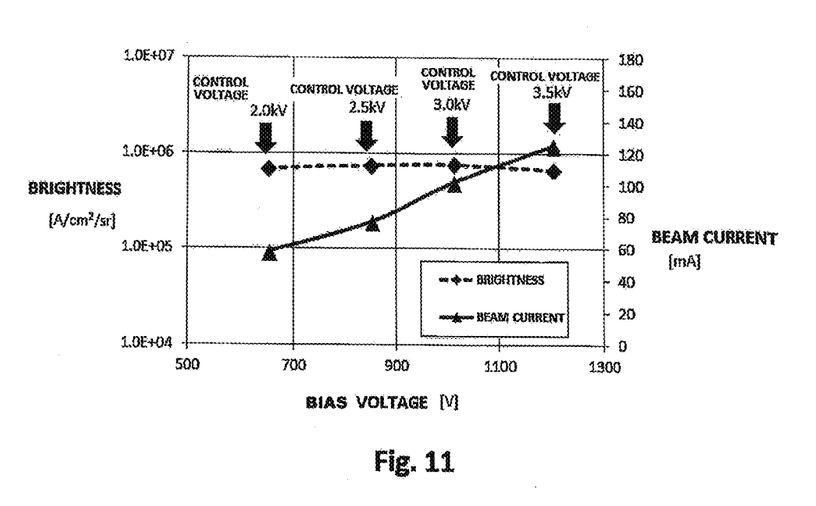
FIG. 11 is a graph showing the results of an extraction of a combination of control voltage and bias voltage that provides a maximum brightness in the inventive electron gun shown in FIG. 4.

A method of controlling the electron gun associated with the present embodiment to maintain the brightness of the electron beam B1 constant if the beam current varies is next described by referring to FIGS. 9-11.

FIG. 9 is a graph showing an example of how the beam current and brightness vary when the bias voltage and the control voltage are varied. FIG. 9 shows the results of simulations of the electron gun characteristics when the controller 22 varies the control voltage to 2.0 kV, 2.5 kV, 3.0 kV, and 3.5 kV and the bias voltage was increased and reduced around 600 V, 850 V, 1,000 V, and 1,200 V.

FIG. 9 shows that the beam current increases with increasing the control voltage and that the brightness of the electron beam B1 produced by the electron gun 10 is several times as large as the brightness (FIG. 8) of the electron beam B2 produced by the related art electron gun 100 for the following probable reasons. The number of thermal electrons emitted per unit area of the tip of the cathode 11 was increased by the control voltage. The lens action of the static electric field produced between the Wehnelt electrode 12 and the control electrode 13 narrowed the virtual source diameter D1.

FIG. 10 is a graph showing one example of how the virtual source diameter and beam semiangle vary when the bias voltage and the control voltage are varied. FIG. 10 shows the results of simulations of the electron gun characteristics when the controller 22 varied the control voltage from 2.0 kV to 2.5 kV, 3.0 kV, and 3.5 kV and increased and reduced the bias voltage around 600 V, 850 V, 1,000 V, and 1,200 V.

FIG. 10 shows that when the control voltage was increased from 2.0 kV to 3.5 kV, the virtual source diameter D1 decreased but the beam semiangle increased. FIG. 9 shows that when the bias voltage was increased and reduced at various values of the control voltage, a maximum brightness occurred at a certain bias voltage.

FIG. 11 is a graph showing the results of an extraction of a combination of control voltage and bias voltage that provides a maximum brightness. FIG. 11 shows that the brightness can be kept constant by varying both control voltage and bias voltage and that the brightness is maintained constant if the beam current is varied within a range from 60 mA to 120 mA. The brightness B of the electron beam B1 is given by $$B = I/(\pi r^2 \cdot \pi \alpha^2) \tag{1}$$

where I is the value of the beam current, r is the radius of the virtual source S1, and α is the beam semiangle.

It is seen from Eq. (1) that the brightness of the electron beam B1 can be increased by increasing the beam current, reducing the radius of the virtual source S1, and reducing the beam semiangle. In the related art, a high bias voltage was needed to reduce the beam semiangle as shown in FIG. 7. On the other hand, when the bias voltage was increased past a certain value of bias voltage, the radius of the virtual source S2 increased rapidly. Therefore, as shown in FIG. 8, the brightness of the electron beam B2 assumes a maximum value at a certain bias voltage. This bias voltage gives rise to only one value of beam current, i.e., only one operative condition. As the beam current is varied from this value of beam current, the brightness drops greatly. Therefore, in the related art, the electron beam B2 of high brightness can be used only under certain conditions of beam current.

In the electron gun 10 associated with the present embodiment, the control electrode 13 increases the strength of the electric field around the tip of the cathode 11 when thermal electrons are extracted from the cathode 11. At this time, if the bias voltage is increased while applying the control voltage, the virtual source diameter decreases but the beam semiangle increases in such a manner that their variations cancel each other as shown in FIG. 10. As indicated by Eq. (1), the virtual source diameter and the beam semiangle are parameters contributing to the magnitude of the brightness. Therefore, even if the beam current is increased while increasing the bias voltage and the control voltage, the maximum value of the brightness of the electron beam B1 does not vary greatly. In consequence, the electron beam B1 can be reached at the powdered sample 8 while maintaining a high brightness even if the beam current is varied.

In order to produce required electron beam B1 from the electron gun 10, combination conditions of the bias voltage and the control voltage as shown in FIG. 11 are stored in the storage device 23 in a corresponding manner to the beam current. The controller 22 reads out a combination condition from the storage device 23 according to the used beam current of the electron beam B1 and sets voltages applied to the various electrodes to appropriate values. This permits the electron gun 10 to vary the beam current for each melting process while maintaining the brightness high.

The electron gun 10 of the thermionic emission type having four electrodes associated with one embodiment as described so far controls the beam current by the bias voltage in a conventional manner. In addition, the gun 10 controls the beam current by the control voltage. Therefore, in the electron beam additive manufacturing machine 1 that cannot use any current-limiting aperture, the beam current can be controlled without reducing the brightness of the electron beam B1. Furthermore, the addition of the control electrode 13 makes the brightness of the electron beam B1 several times as high as the brightness of the electron beam B2 emitted by the related art electron gun 100.

Thermal electrons can be easily focused by recessing the Wehnelt electrode 12 in a direction reverse to the direction of emission of thermal electrons. Furthermore, the thermal electron emissive region of the cathode 11 can be controlled more easily. Emission of thermal electrons from the tapering portion 11b of the cathode 11 is suppressed.

The tilt angle β of the tapering portion 13b formed on the control electrode 13 is set greater than the tilt angle α of the tapering portion 12b formed on the Wehnelt electrode 12. Therefore, the second opening 13c in the control electrode 13 can be placed closer to the tip of the cathode 11 inserted in the first opening 12c. Consequently, the control electrode 13 can pull thermal electrons from the tip of the cathode 11 and increase the beam current. Furthermore, the electric field generated between the Wehnelt electrode 12 and the control electrode 13 acts as a lens. This makes it possible to set the virtual source diameter D1 smaller than the related art virtual source diameter D2.

It is to be understood that the present invention is not restricted to the above-described embodiment. Rather, various examples of application and modifications are possible without departing from the gist of the present invention set forth in the claims. For example, the Wehnelt electrode 12 may not have the tapering portion 11b, and the control electrode 13 may not have the tapering portion 13b. Additionally, each tapering portion of the cathode 11, Wehnelt electrode 12, and control electrode 13 may be shaped like a truncated pyramid or circular cylinder along its central axis.

In the above-described embodiment, the configuration of a machine has been described in detail to facilitate understanding the present invention. The invention is not restricted to a machine having all of the configurations described. Furthermore, some configuration of some embodiment may be replaced by configuration of other embodiment. In addition, configuration of other embodiment may be added to the configuration of some embodiment. Further, other configurations may be added to some configurations of each embodiment. Some configurations of each embodiment may be deleted. Moreover, some configuration of one embodiment may be replaced by other configurations. Additionally, control lines and information lines which are considered to be necessary for explanation are shown. Not all control lines and information lines of the finished product may not be shown. In practice, it may be considered that almost all configurations are interconnected.

Having thus described my invention with the detail and particularity required by the Patent Laws, what is desired protected by Letters Patent is set forth in the following claims.

The invention claimed is:
1. An electron gun comprising:
   a cathode heated by a heating power supply and operative to emit thermal electrons from a tip of the cathode;
   a Wehnelt electrode having a central axis along which a first opening is formed, the tip of the cathode being inserted in the first opening, the Wehnelt electrode being operative to control a thermal electron emissive region by application of a bias voltage to the Wehnelt electrode and to focus the thermal electrons;
   a control electrode having a central axis along which a second opening is formed, the control electrode being operative to cause the thermal electrons emitted from the tip of the cathode to pass into the second opening by application of a control voltage to the control electrode;
   an anode having a central axis along which a third opening is formed, the anode being operative to accelerate the thermal electrons emitted from the cathode by application of an accelerating voltage to the anode such that the thermal electrons passed through the second opening pass into the third opening and impinge as an electron beam on a powdered sample; and
   a controller for settings the bias voltage and the control voltage based on combination conditions of the bias voltage and the control voltage to maintain the bright- ness of the electron beam constant when a beam current produced by the electron beam impinging on the powdered sample is varied.

2. The electron gun as set forth in claim 1, wherein said cathode has a tapering portion shaped like a truncated cone, truncated pyramid, or circular cylinder having a front end including a flat surface portion, and wherein the flat surface portion is inserted in said first opening and located on a side of said control electrode.

3. The electron gun as set forth in claim 2,
wherein said Wehnelt electrode has a tapering portion extending towards said cathode and tilted at a tilt angle,
wherein said control electrode has a tapering portion extending towards the Wehnelt electrode and tilted at a tilt angle, and
wherein the tilt angle of the tapering portion of the control electrode is greater than the tilt angle of the tapering portion of the Wehnelt electrode.

4. An electron beam additive manufacturing machine comprising:
an electron gun producing an electron beam;
a support stage on which a powdered sample is tightly spread;
an electron optical system for scanning the electron beam over the stage;
a sample supply system for spreading the powdered sample tightly on the support stage; and
a control system for controlling the electron gun,
wherein said electron gun has:
a cathode heated by a heating power supply and having a tip from which thermal electrons are emitted;
a Wehnelt electrode having a central axis along which a first opening is formed, the tip of the cathode being inserted in the first opening, the Wehnelt electrode being operative to control a thermal electron emissive region of the cathode and to focus the thermal electrons by application of a bias voltage to the Wehnelt electrode;
a control electrode having a central axis along which a second opening is formed, the control electrode being operative to cause the thermal electrons emitted from the tip of the cathode to pass into the second opening by application of a control voltage to the control electrode; and
an anode having a central axis along which a third opening is formed, the anode being operative to accelerate the thermal electrons emitted from the cathode and to cause the thermal electrons passed through the second opening to pass into the third opening and impinge as an electron beam on a powdered sample by application of an accelerating voltage to the anode, and
wherein said control system sets the bias voltage and the control voltage according to combination conditions of the bias voltage and the control voltage in order to maintain the brightness of the electron beam constant when a beam current produced by the electron beam impinging on the powdered sample is varied.

5. A method of controlling an electron gun, comprising the steps of:
emitting thermal electrons from a tip of a cathode heated by a heating power supply;
controlling a thermal electron emissive region of the cathode and focusing the thermal electrons by applying a bias voltage to a Wehnelt electrode having a central axis along which a first opening is formed, the tip of the cathode being inserted in the first opening;
applying a control voltage to a control electrode having a central axis along which a second opening is formed to cause the thermal electrons emitted from the tip of the cathode to pass into the second opening;
applying an accelerating voltage to an anode having a central axis along which a third opening is formed to accelerate the thermal electrons emitted from the cathode such that the thermal electrons passed through the second opening pass into the third opening and impinge as an electron beam on a powdered sample; and
setting the bias voltage and the control voltage according to combination conditions of the bias voltage and the control voltage under control of a control system in order to maintain the brightness of the electron beam constant when a beam current produced by the electron beam impinging on the powdered sample is varied.

* * * * *